United States Patent
Lin et al.

(10) Patent No.: US 8,933,630 B2
(45) Date of Patent: Jan. 13, 2015

(54) ARC CHAMBER WITH MULTIPLE CATHODES FOR AN ION SOURCE

(71) Applicant: Taiwan Semiconductor Manufacturing Co., Ltd., Hsin-Chu (TW)

(72) Inventors: Chin-Tsung Lin, New Taipei (TW); Hsiao-Yin Hsieh, Zhubei (TW); Chi-Hao Huang, Zhunan Township (TW); Hong-Hsing Chou, Jhubei (TW); Yeh-Chieh Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/719,309

(22) Filed: Dec. 19, 2012

(65) Prior Publication Data
US 2014/0167614 A1    Jun. 19, 2014

(51) Int. Cl.
*H01J 7/24* (2006.01)
*H01J 37/08* (2006.01)
*H01J 37/317* (2006.01)

(52) U.S. Cl.
CPC ............. *H01J 37/08* (2013.01); *H01J 37/3171* (2013.01)
USPC .............. 315/111.91; 315/111.21; 315/359.1; 313/230; 250/423 R; 250/492.21; 250/426

(58) Field of Classification Search
USPC ............. 315/111.91–111.21, 111.21–111.91; 250/423 R, 427
See application file for complete search history.

(56) References Cited

U.S. PATENT DOCUMENTS

| | | | |
|---|---|---|---|
| 4,942,304 A | 7/1990 | Boston | |
| 5,517,077 A * | 5/1996 | Bright et al. | 313/359.1 |
| 5,892,232 A | 4/1999 | Tsai et al. | |
| 6,239,440 B1 | 5/2001 | Abbott | |
| 6,300,636 B1 | 10/2001 | Shih et al. | |
| 6,639,223 B2 * | 10/2003 | Reyes | 250/425 |
| 7,138,768 B2 | 11/2006 | Maciejowski et al. | |
| 7,557,364 B2 * | 7/2009 | Ito et al. | 250/492.21 |
| 7,655,931 B2 * | 2/2010 | Gupta | 250/492.21 |
| 7,853,364 B2 * | 12/2010 | Deakins et al. | 700/289 |
| 7,893,408 B2 * | 2/2011 | Hieftje et al. | 250/423 R |
| 8,154,210 B2 * | 4/2012 | Horsky et al. | 315/111.81 |
| 8,501,624 B2 * | 8/2013 | Koo et al. | 438/689 |
| 8,702,920 B2 * | 4/2014 | Ikejiri et al. | 204/298.12 |

OTHER PUBLICATIONS

Renau, A., "Current Capabilities and Future Needs for Semiconductor Ion Implantation(invited)a)", Review of Scientific Instruments, 2010, 81:02B907-1-12.

* cited by examiner

*Primary Examiner* — Douglas W Owens
*Assistant Examiner* — Srinivas Sathiraju
(74) *Attorney, Agent, or Firm* — Duane Morris LLP

(57) ABSTRACT

An apparatus for extending the useful life of an ion source, comprising an arc chamber containing a plurality of cathodes to be used sequentially and a plurality of repellers to protect cathodes when not in use. The arc chamber includes an arc chamber housing defining a reaction cavity, gas injection openings, a plurality of cathodes, and at least one repeller element. A method for extending the useful life of an ion source includes providing power to a first cathode of an arc chamber in an ion source, operating the first cathode, detecting a failure or degradation in performance of the first cathode, energizing a second cathode, and continuing operation of the arc chamber with the second cathode.

20 Claims, 8 Drawing Sheets

ARC CHAMBER WITH MULTIPLE CATHODES FOR AN ION SOURCE

FIELD

The present disclosure generally relates to ion implantation systems. More particularly, the present disclosure relates to arc chambers of ion sources used in ion implantation systems.

BACKGROUND

Ion implantation is a process that alters the physical, chemical, or electrical properties of a material and is used in a wide range of commercial and industrial applications. In general terms, an ion implanter generates an ion beam, accelerates the ion beam in an electrical field, and impacts the ion beam into a solid material. Ion implantation is used extensively in the fabrication of semiconductors, where doped regions such as sources and drains are formed in semiconductor substrates by implanting ion impurities.

One of the components of an ion implanter is the ion source, which generates the ion beam. An ion source forms an ion beam by admitting a small amount of gas into an arc chamber's reaction cavity, where a heated cathode emits electrons causing ionization of the gas and the formation of a plasma in the reaction cavity. The positively-charged ions are then drawn from the arc chamber using a negatively-charged anti-cathode positioned near a small opening in the arc chamber through which the ion beam exits.

There are two types of widely-used ion sources: directly heated cathodes, having a cathode for emitting electrons—usually a single-turn helical filament—mounted openly in the reaction cavity, and indirectly heated cathodes, having a cathode heated by electron bombardment from a filament causing thermionic emission of electrons from the cathode into the reaction cavity.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Unfortunately, ion source cathodes are prone to malfunction. Common modes of failure for an ion source cathode include filament degradation or failure, typically caused by exposing the filament to the corrosive effects of the gas and plasma in the reaction cavity, and component degradation, where the gas admitted into the arc chamber gradually forms deposits on the filament and cathode, resulting in cathode performance below an acceptable threshold.

The frequent malfunctions of ion source cathodes result in a high rate of repair or replacement. These repairs and ion source cathode replacements may be time-consuming and costly because an ion implanter works at vacuum pressures and the vacuum is broken before maintenance may be performed. In most applications an ion implanter is kept running continuously between failures to maximize throughput. Thus, the frequent malfunctions of ion source cathodes reduce ion implanter efficiency and productivity.

The arc chambers illustrated in FIGS. 1A, 1B, 2A, and 2B are examples in accordance with some embodiments of the present disclosure. As will be known to one of skill in the art, an arc chamber is disposed within an ion source. An ion source forms an ion beam by admitting a small amount of gas into the arc chamber, ionizing the gas with a heated cathode, and drawing positively-charged ions from the arc chamber using a negatively-charged anti-cathode.

Figure 1A:
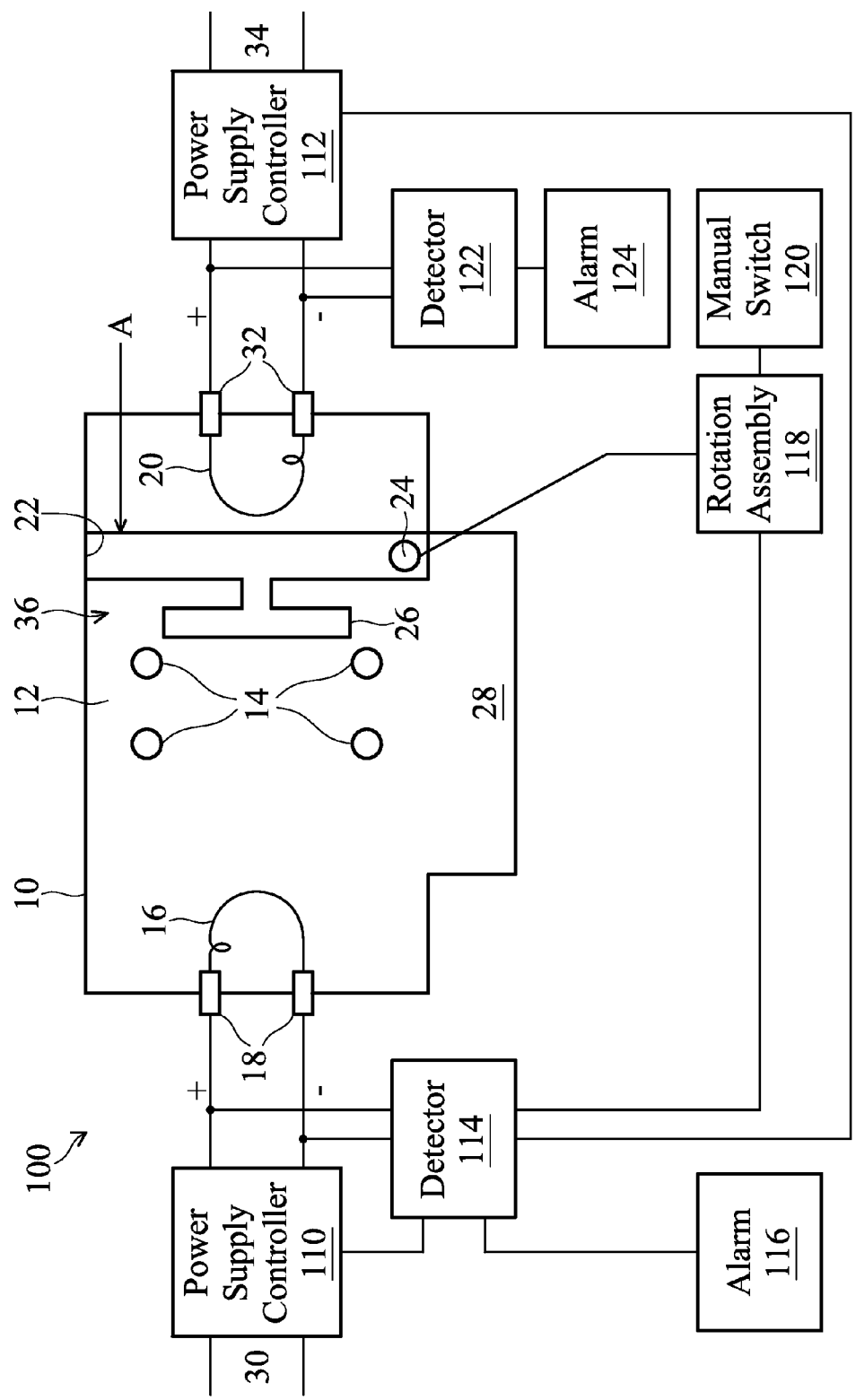
FIG. 1A is a top view of an arc chamber in accordance with some embodiments of the present disclosure with the first cathode in use.

FIG. 1A is a top schematic view of one example of an arc chamber 100 in accordance with some embodiments of the present disclosure. As will be known to one of skill in the art, FIG. 1A illustrates some embodiments of the present disclosure wherein the cathodes mounted in the arc chamber 100 are directly heated, referred to as Bernas-type cathodes. The arc chamber 100 is generally rectangular or cylindrical in shape with an arc chamber housing 10 forming a reaction cavity 12 and a recess 28. The arc chamber housing 10 is perforated by a plurality of gas injection openings 14, which admit gas to be ionized during operation of the arc chamber 100.

A first directly heated cathode 16 is mounted at one end of the arc chamber 100 and disposed within the reaction cavity 12. In one example of the present disclosure, the first directly heated cathode 16 is a single-turn helical filament. The first directly heated cathode 16 is electrically isolated from the arc chamber housing 10 by a pair of isolators 18 and connected to a first power supply 30. A second directly heated cathode 20 is mounted opposite the first directly heated cathode 16. The second directly heated cathode is isolated from the arc chamber housing 10 by a pair of isolators 32 and connected to a second power supply 34, which can be the same as the first power supply 30 or can be an independent power supply.

A repeller element 36 is formed from repeller 26 mounted to clapboard 22. An axial pin or hinge 24 is disposed through the clapboard 22, permitting the repeller element 36 to rotate around the axis of the axial pin or hinge 24 from a first position A across the reaction cavity 12 to a second position B in a recess of the arc chamber housing 10. The repeller element 36 is connected to a rotation assembly 118 which rotates the repeller element 36 from the first position A to the second position B. The rotation assembly 118 can be implemented in conventional ways, such as by using a motor. The repeller 26 and clapboard 22 can be constructed from any of a variety of materials including but not limited to tungsten, molybdenum, boron nitride, or ceramic and combinations or composites thereof.

The embodiment illustrated in FIG. 1A can further include circuitry to monitor cathode performance, notify an operator of cathode failure or degradation, and automatically switch between the first directly heated cathode 16 and the second directly heated cathode 20. A first detector 114 monitors electric current through first directly heated cathode 16, using a detection logic configured to detect when first directly heated cathode 16 has failed or degraded. First detector 114 is connected to and controls a first power supply controller 110, a first cathode alarm 116, the rotation assembly 118, and a second power supply controller 112. A second detector 122 monitors electric current through second directly heated cathode 20 and is connected to a second cathode alarm 124. A manual switch is provided and connected to the rotation assembly 118 to permit an operator to manually switch between the first directly heated cathode 16 and the second directly heated cathode 20.

Figure 1B:
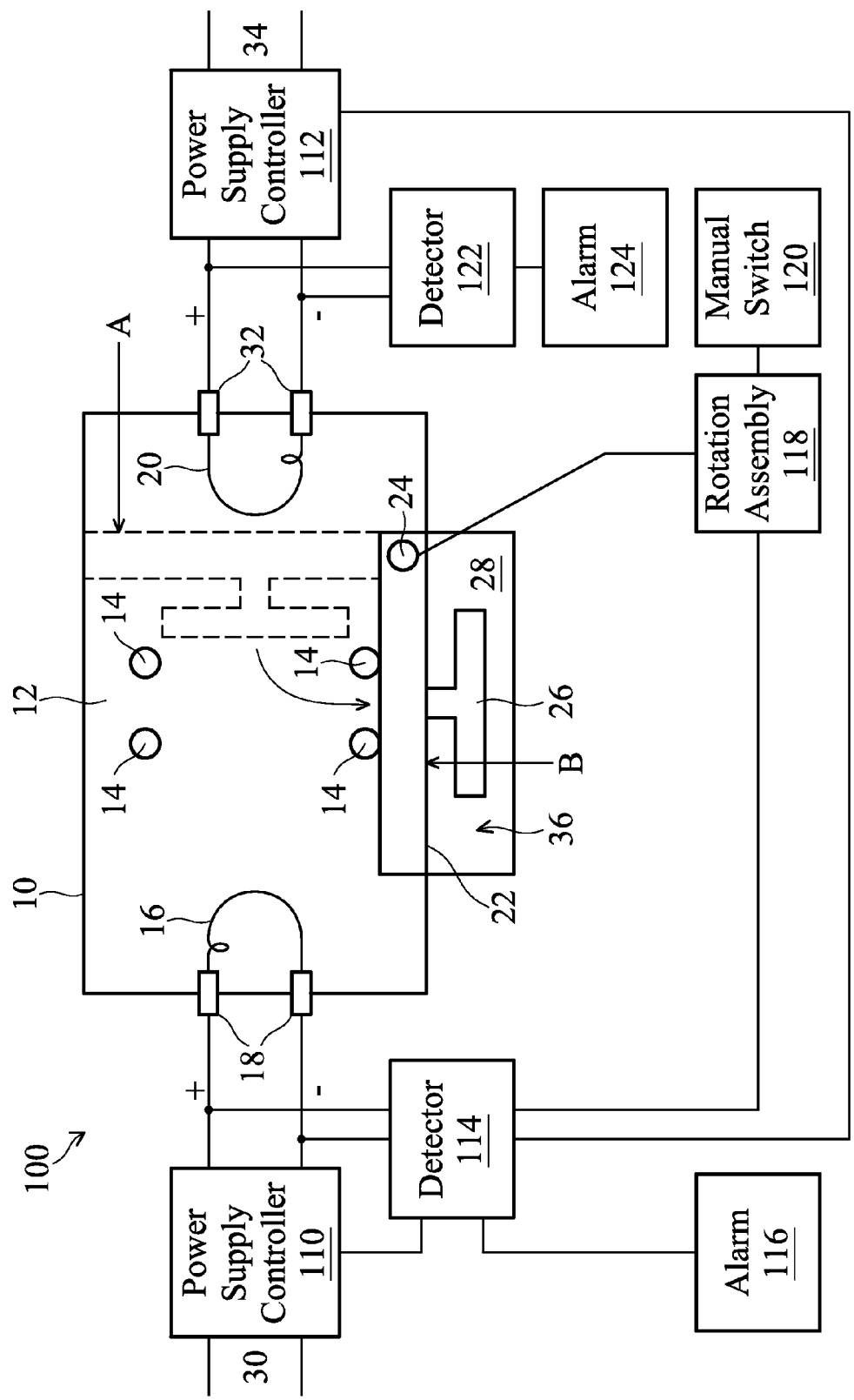
FIG. 1B is a top view of the arc chamber of FIG. 1A, with the second cathode in use.

FIG. 1B is a top view of the same example of an arc chamber 100 illustrated in FIG. 1A. In this view, the repeller element 36, comprising the repeller 26 mounted to a clapboard 22, is rotated via the axial pin 24 and is now disposed within the recess 28. This uncovers the second directly heated cathode 20.

The arc chamber 100 illustrated in FIG. 1A is first operated with the repeller element 36, comprising repeller 26 mounted to clapboard 22, positioned to protect second directly heated cathode 20 from ion bombardment and plasma generated by first directly heated cathode 16. First directly heated cathode 16 is energized by first power supply 30 and the arc chamber 100 is operated until first directly heated cathode 16 fails or the performance of first directly heated cathode 16 deteriorates below an acceptable threshold. The operation of arc chamber 100 is then switched between the first directly heated cathode 16 and the second directly heated cathode 20 either automatically or manually.

In automatic mode, first detector 114 detects the failure of first directly heated cathode 16 and discontinues power to first directly heated cathode 16 via first power supply controller 110. First detector 114 activates first cathode alarm 116, which provides a visual or aural notification to the operator of the failure or degradation of first directly heated cathode 16. First detector 114 orders rotation assembly 118 to rotate repeller element 36 via axial pin 24 from a first position A across the reaction cavity 12 to a second position B in a recess of the arc chamber housing 10. This rotation of repeller element 36 exposes second directly heated cathode 20 and disposes repeller element 36 within recess 28. First detector 114 additionally orders second power supply controller 112 to energize second directly heated cathode 20. Thus second directly heated cathode 20 is exposed to reaction cavity 12 and energized, allowing operation of arc chamber 100 to continue.

In manual mode one or more of the actions performed in automatic mode by first detector 114 is performed by the operator. For example, once the first detector 114 detects the failure of first directly heated cathode 16 and activates first cathode alarm 116 the operator is able to manually rotate repeller element 36 by use of manual switch 120. Manual switch 120 directs rotation assembly 118 to rotate repeller element 36. Additionally, the operator can replace first detector 114 altogether. The operator would detect the failure or degradation of first directly heated cathode 16 by monitoring the ion implanter's performance during use, elect to switch between first directly heated cathode 16 and second directly heated cathode 20, manually discontinue first power supply 30 to first directly heated cathode 16 via a switch or removal of power supply cables, manually rotate repeller element 36 by use of manual switch 120, and manually energize second directly heated cathode 20 with second power supply 34 via a switch or manual manipulation of power supply cables. Thus second directly heated cathode 20 is exposed to reaction cavity 12 and energized, allowing operation of arc chamber 100 to continue.

Using either automatic or manual mode the second directly heated cathode 20 can be deployed without breaking the vacuum, and without re-evacuating the chamber.

As will be appreciated by one of skill in the art, the present disclosure is not limited to a first directly heated cathode 16 and second directly heated cathode 20 as illustrated in FIGS. 1A and 1B. Additional directly heated cathodes can be mounted in the arc chamber 100 in a similar manner and can be disposed within the reaction cavity. As desired, additional repeller elements can also be added to protect additional directly heated cathodes from ion bombardment while other directly heated cathodes are energized.

Figure 2A:
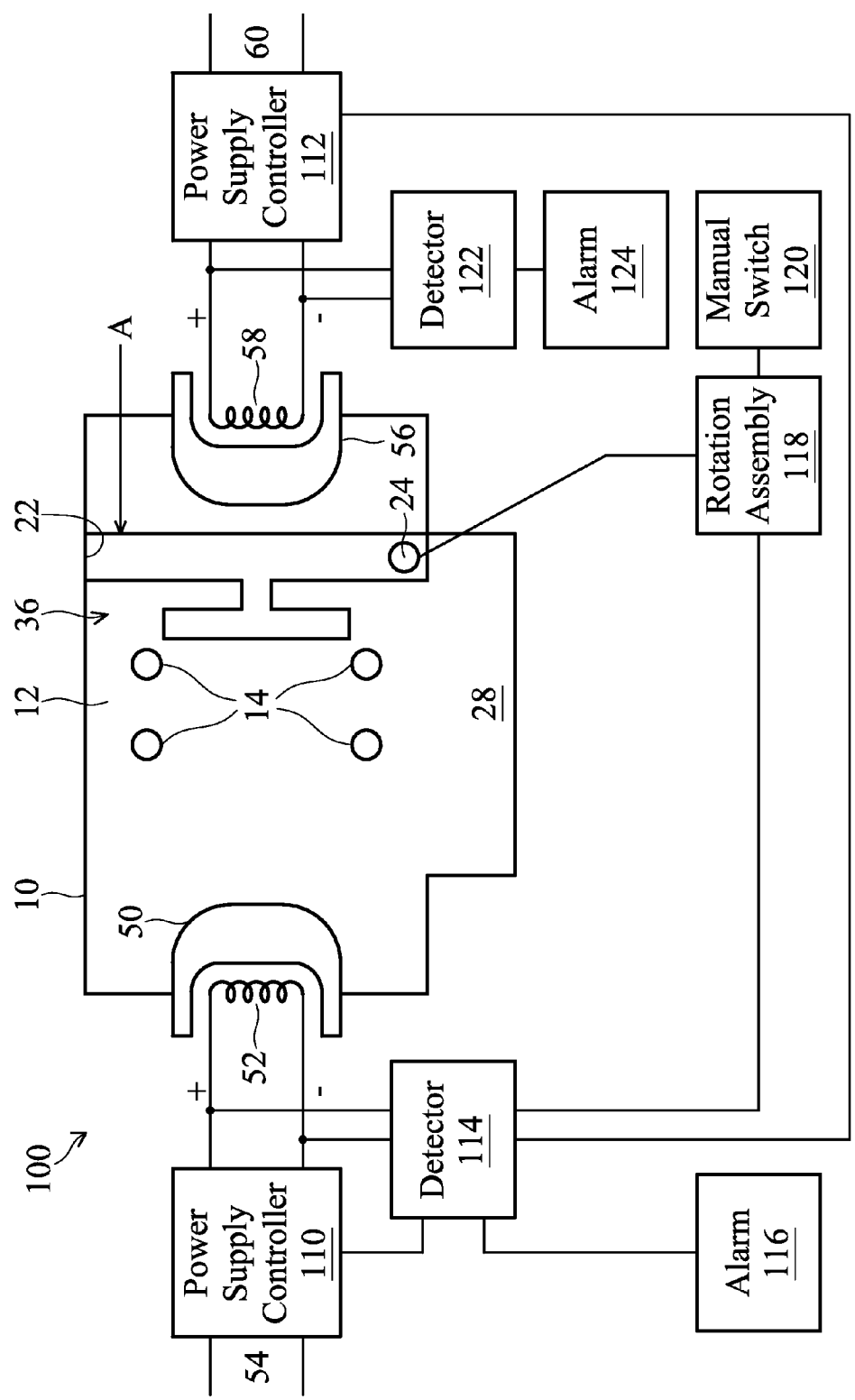
FIG. 2A is a top view of an arc chamber in accordance with some embodiments of the present disclosure with the first cathode in use.

FIG. 2A is a top view of one example of an arc chamber 100 in accordance with some embodiments of the present disclosure. FIG. 2A illustrates some embodiments of the present disclosure wherein the cathodes mounted in the arc chamber 100 are indirectly heated cathodes. This embodiment can be identical to the embodiment shown in FIG. 1A and as described above with the exception of the cathode configuration.

In FIG. 2A a first indirectly heated cathode 50 is mounted at one end of the arc chamber 100 and disposed within the reaction cavity 12. A first filament 52 is disposed within first indirectly heated cathode 50 and connected to first power supply 54. A second indirectly heated cathode 56 is mounted opposite first indirectly heated cathode 50. A second filament 58 is disposed within second indirectly heated cathode 56 and connected to second power supply 60, which can be the same as the first power supply 54 or can be an independent power supply.

Figure 2B:
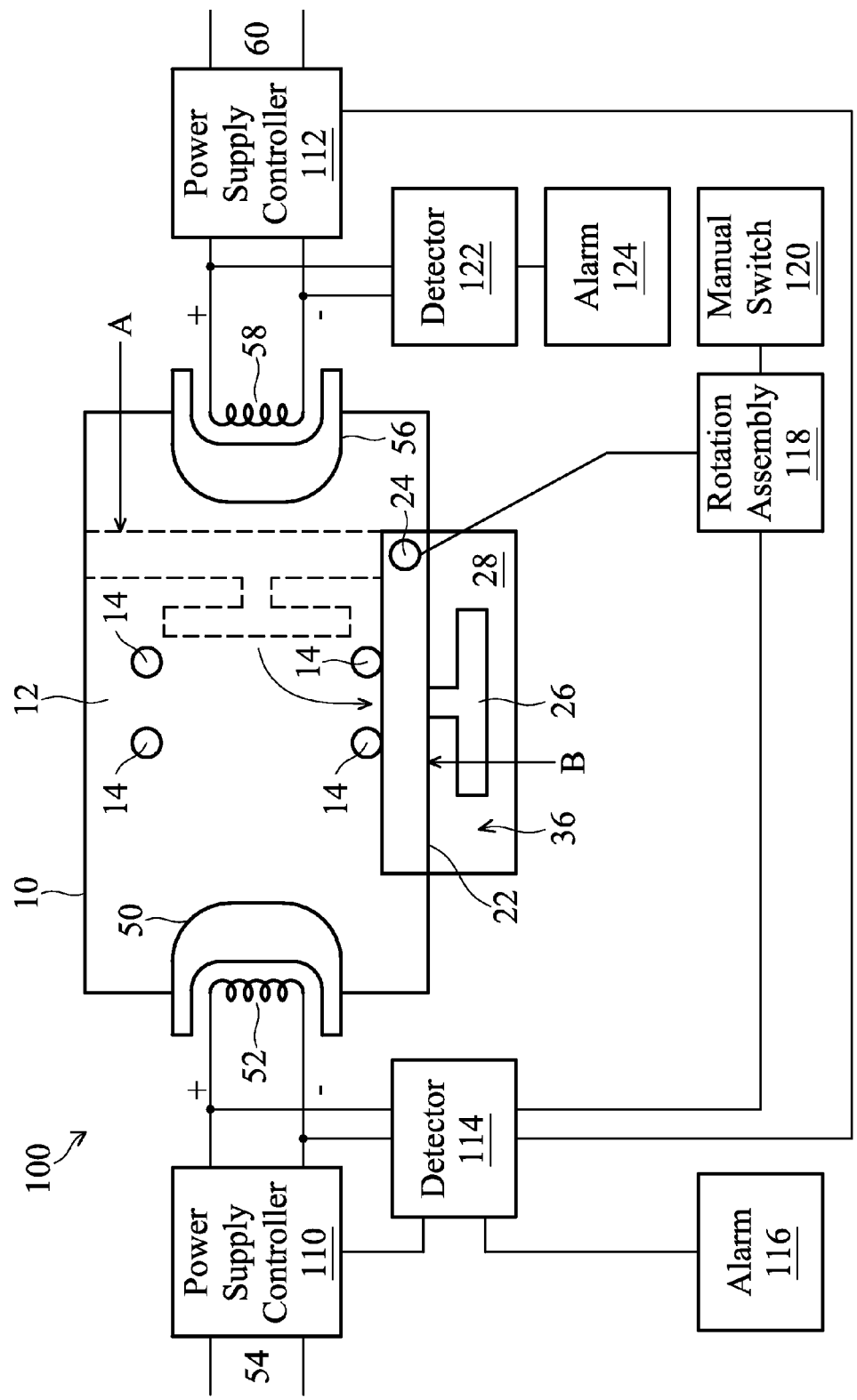
FIG. 2B is a top view of the arc chamber of FIG. 2A with the second cathode in use.

FIG. 2B is a top view of the arc chamber 100 of FIG. 2A, with the repeller element 36 rotated to a second position B exposing the second indirectly heated cathode 56. The cathode configuration of FIG. 2B including first indirectly heated cathode 50, first filament 52, first power supply 54, second indirectly heated cathode 56, second filament 58, and second power supply 60, is identical to the cathode configuration depicted in FIG. 2A and described above.

The arc chamber 100 illustrated in FIG. 2A is first operated with the repeller element 36, comprising repeller 26 mounted to clapboard 22, positioned to protect second indirectly heated cathode 56 from ion bombardment and plasma generated by first directly heated cathode 16. First indirectly heated cathode 50 is energized by first power supply 30 and the arc chamber 100 is operated until first indirectly heated cathode 50 fails or the performance of first indirectly heated cathode 50 deteriorates below an acceptable threshold. The operation of arc chamber 100 is then switched between the first indirectly heated cathode 50 and second indirectly heated cathode 56 either automatically or manually. The automatic and manual modes of switching between the first indirectly heated cathode 50 and second indirectly heated cathode 56 can be identical to the embodiment shown in FIG. 1A and as described above with the exception of the cathode configuration.

As will be appreciated by one of ordinary skill in the art, the present disclosure is not limited to a first indirectly heated cathode 50 and second indirectly heated cathode 56 as illustrated in FIGS. 2A and 2B. Additional indirectly heated cathodes can be mounted in the arc chamber 100 in a similar manner and can be disposed within the reaction cavity. If desired, additional repeller elements can also be added to protect additional indirectly heated cathodes from ion bombardment while other indirectly heated cathodes are energized.

Figure 3:
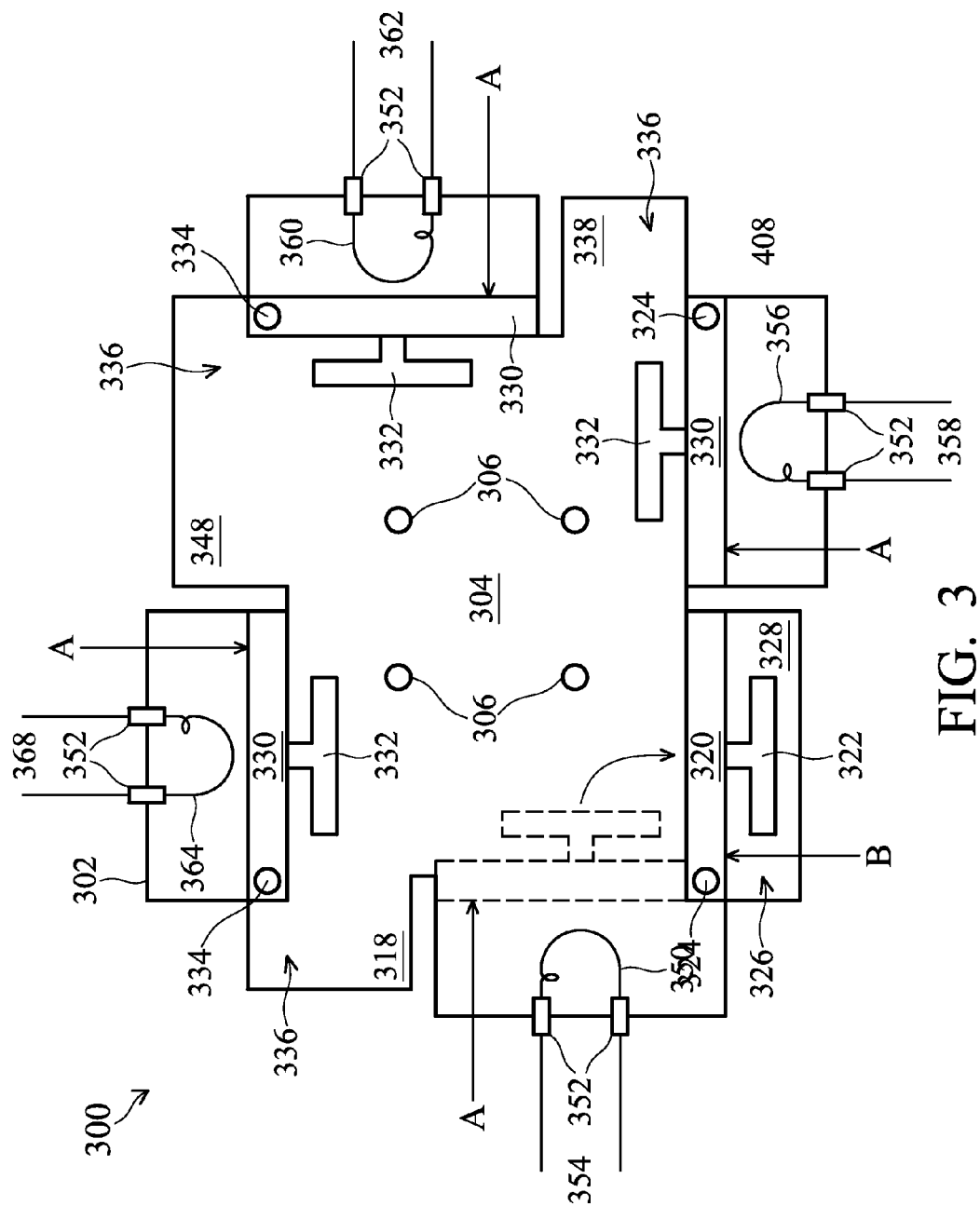
FIG. 3 is a top view of an arc chamber in accordance with some embodiments of the present disclosure with the first cathode in use.

FIG. 3 is a top schematic view of one example of an arc chamber 300 in accordance with some embodiments of the present disclosure. As will be known to one of skill in the art, FIG. 3 illustrates some embodiments of the present disclosure wherein the cathodes mounted in arc chamber 300 are directly heated, referred to as Bernas-type cathodes.

In this embodiment, an arc chamber housing 302 forms a reaction cavity 304 containing four cathodes and four repeller elements. Arc chamber housing 302 is perforated by a plurality of gas injection openings 306, which admit gas to be ionized during operation of the arc chamber 300. Arc chamber housing 302 further forms first recess 328, second recess 338, third recess 348, and fourth recess 318.

A first directly heated cathode 350 is mounted in arc chamber 300 and electrically isolated from arc chamber housing 302 by a pair of isolators 352. First directly heated cathode 350 is connected to first power supply 354. A first repeller element 326 is formed from a first repeller 322 mounted to a first clapboard 320. A first axial pin 324 is disposed through clapboard 320, permitting repeller element 326 to rotate around the axis of the axial pin 324 from a first position A covering first directly heated cathode 350 to a second position B in first recess 328. FIG. 3 illustrates the embodiment with first directly heated cathode 350 in use. First repeller element 326 is disposed within first recess 328 while first directly heated cathode 350 is energized.

Three additional directly heated cathodes are shown in FIG. 3. A second directly heated cathode 356 is electrically isolated from arc chamber housing 302 by a pair of isolators 352 and is connected to second power supply 358. A third directly heated cathode 360 is electrically isolated from arc chamber housing 302 by a pair of isolators 352 and is connected to third power supply 362. A fourth directly heated cathode 364 is electrically isolated from arc chamber housing 302 by a pair of isolators 352 and is connected to fourth power supply 368. Each power supply can be shared between any of the plurality of filaments or can be independent.

Each of these additional directly heated cathodes are protected from ion bombardment by a repeller element 336 comprising a repeller 332 mounted to a clapboard 330. An axial pin 334 is disposed through clapboard 330, permitting repeller element 326 to rotate around the axis of axial pin 324. Each repeller element 336 is shown in a first position A covering a directly heated cathode. In this first position A repeller element 336 protects a directly heated cathode from ion bombardment. When rotated around the axis of axial pin 324, each repeller element placed in a second position B disposed within a recess in the arc chamber housing. In this second position B repeller element 336 uncovers a directly heated cathode to permit arc chamber operations with this directly heated cathode energized.

Figure 4:
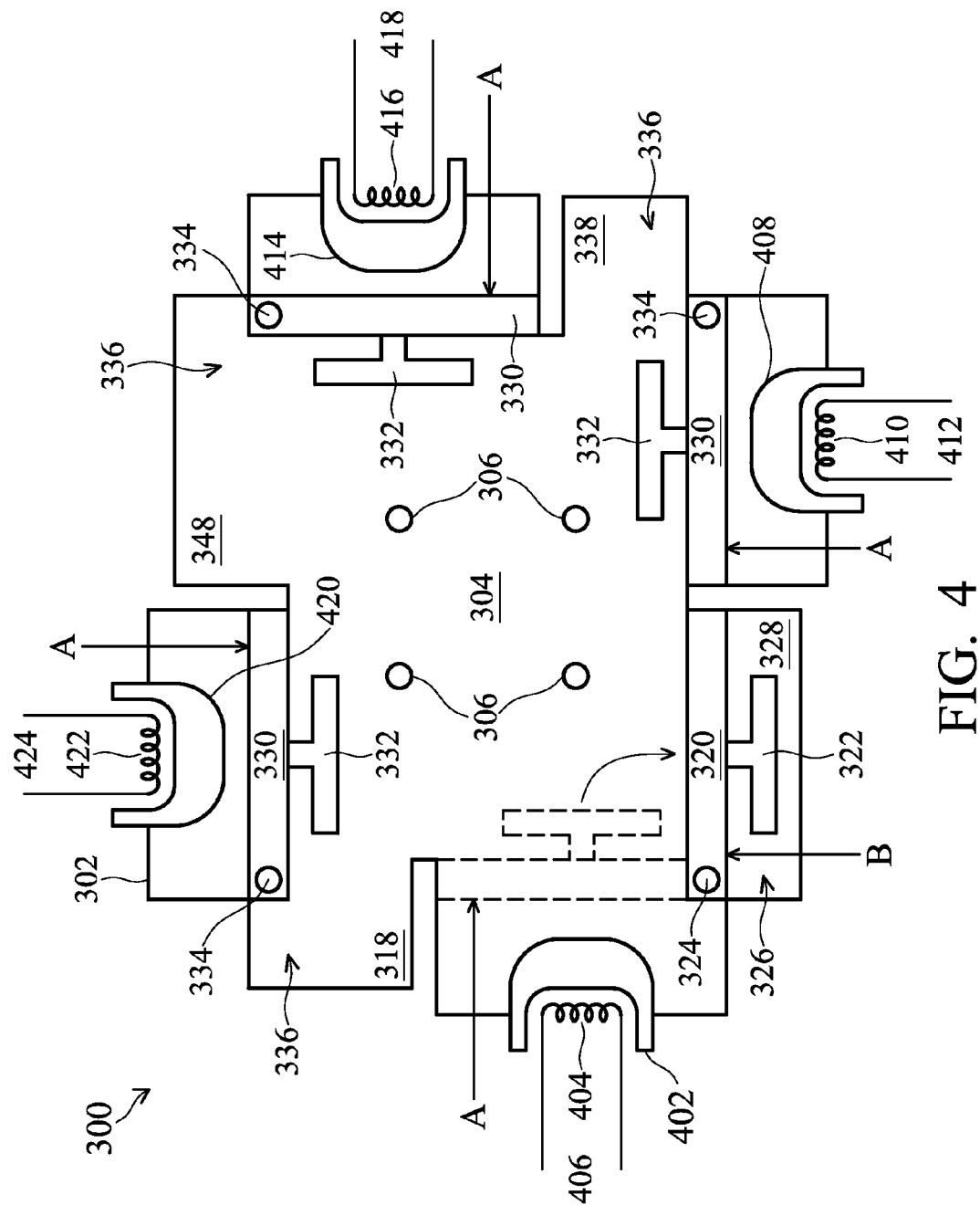
FIG. 4 is a top view of an arc chamber in accordance with some embodiments of the present disclosure with the first cathode in use.

FIG. 4 is a top schematic view of one example of an arc chamber 400 in accordance with some embodiments of the present disclosure. As will be known to one of skill in the art, FIG. 4 illustrates some embodiments of the present disclosure wherein the cathodes mounted in arc chamber 400 are indirectly heated cathodes. This embodiment can be identical to the embodiment shown in FIG. 3 and as described above with the exception of the cathode configuration.

In FIG. 4 a first indirectly heated cathode 402 is mounted to the arc chamber housing 302 and disposed within the reaction cavity 304. A first filament 404 is disposed within first indirectly heated cathode 402 and connected to first power supply 406. A second indirectly heated cathode 408 is mounted to the arc chamber housing 302 and disposed within the reaction cavity 304. A second filament 410 is disposed within second indirectly heated cathode 408 and connected to second power supply 412. A third indirectly heated cathode 414 is mounted to the arc chamber housing 302 and disposed within the reaction cavity 304. A third filament 416 is disposed within third indirectly heated cathode 418 and connected to third power supply 418. A fourth indirectly heated cathode 420 is mounted to the arc chamber housing 302 and disposed within the reaction cavity 304. A fourth filament 422 is disposed within fourth indirectly heated cathode 420 and connected to fourth power supply 424. Each power supply can be shared between any of the plurality of filaments or can be independent.

Figure 5:
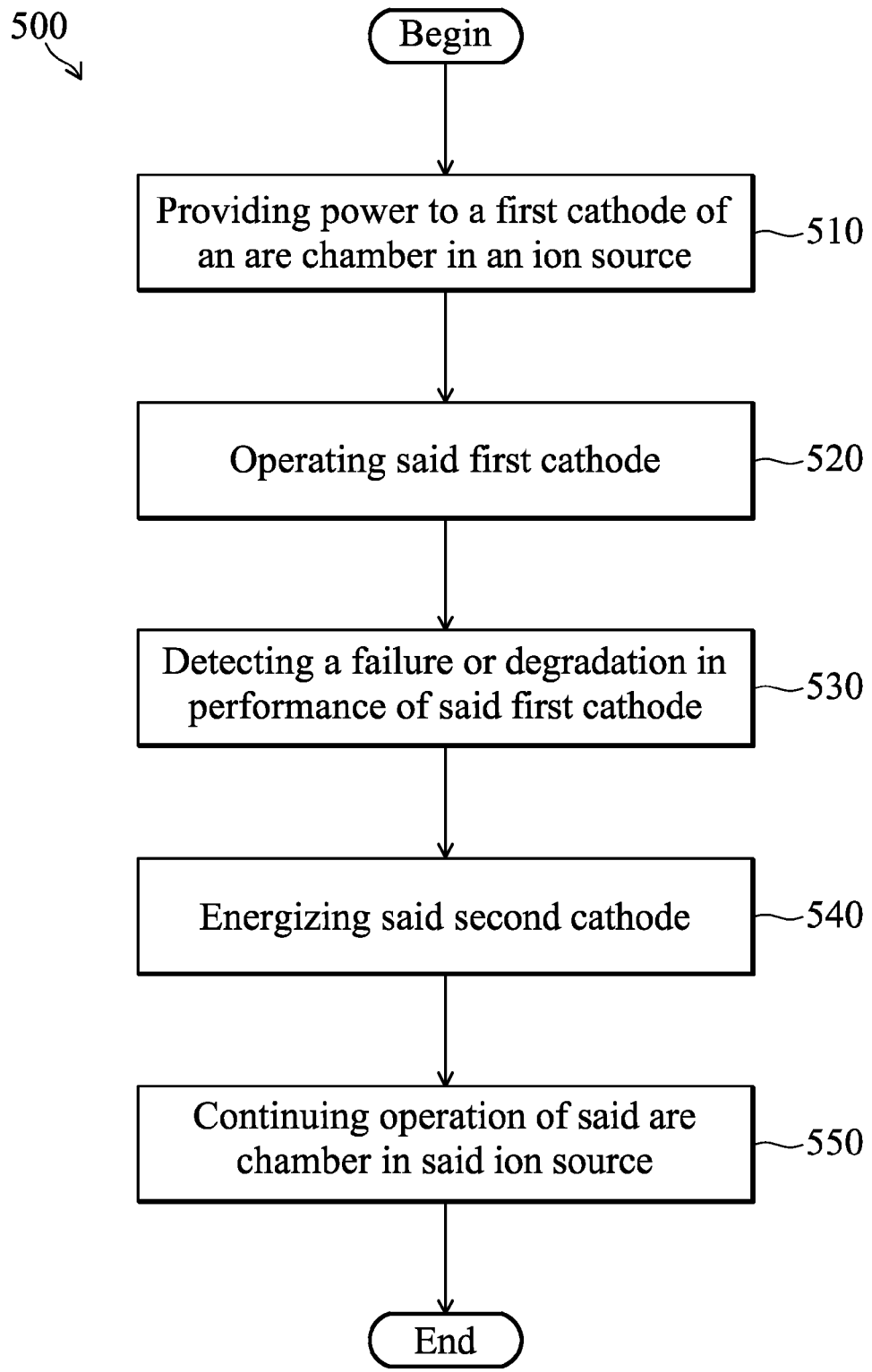
FIG. 5 is a flow diagram of a method in accordance with some embodiments.

The present disclosure further provides a method for extending the useful life of an ion source. FIG. 5 is a flow diagram of one example of a method in accordance with some embodiments. After process 500 begins, power is provided at block 510 to a first cathode in an arc chamber. At block 520 the first cathode is operated, and at block 530 the failure or degradation in performance of the first cathode is detected. A second cathode is energized at block 540, and operation of the arch chamber is continued at block 550.

Figure 6:
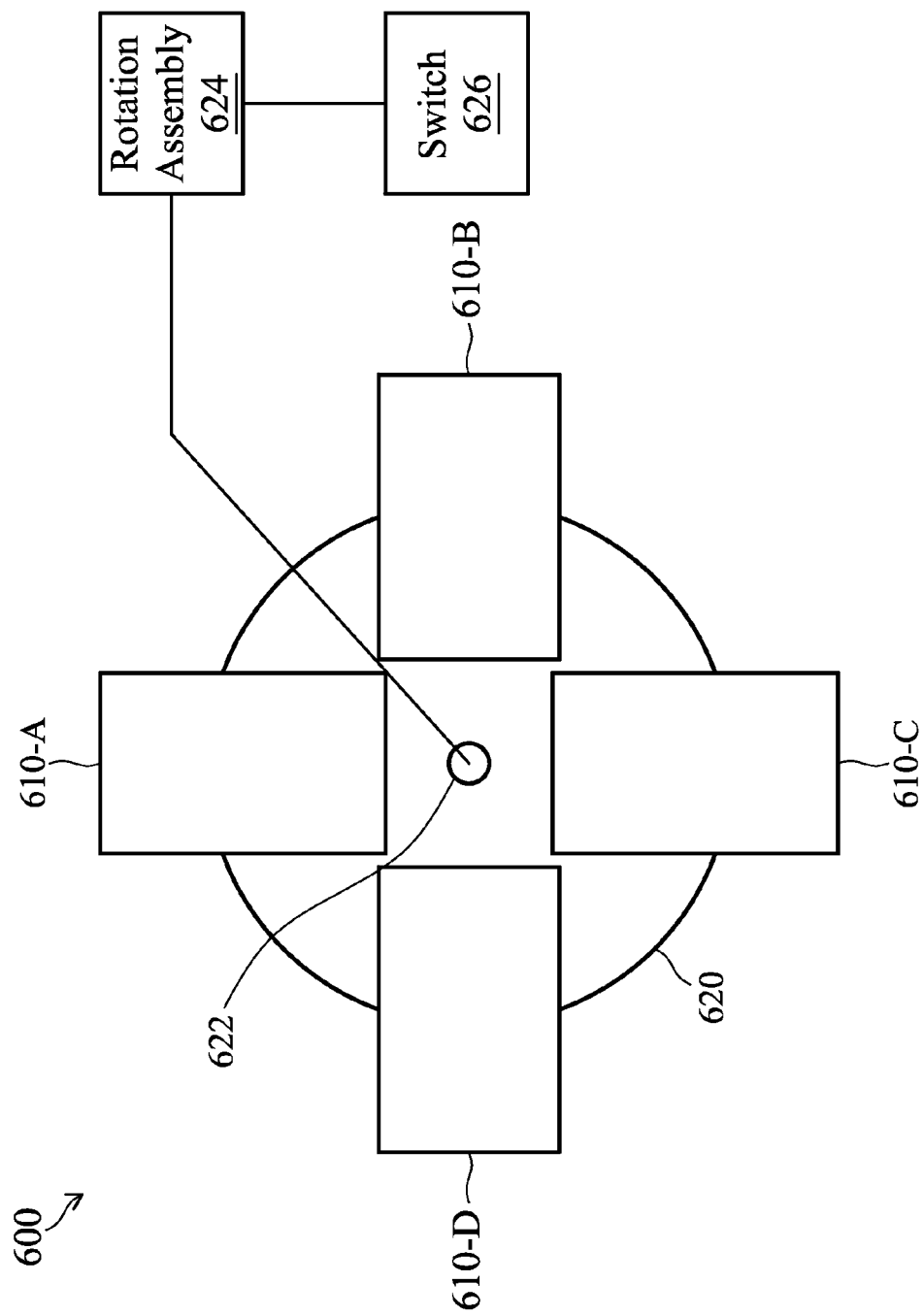
FIG. 6 is a top view of an apparatus for extending the useful life of an ion source in accordance with some embodiments of the present disclosure.

FIG. 6 is a top schematic view of a further embodiment. FIG. 6 illustrates an apparatus 600 for extending the useful life of an ion source by providing a plurality of arc chambers. Apparatus 600 comprises a plurality of arc chambers (denoted 610-A, 610-B, 610-C, and 610-D) mounted to a plate 620. Plate 620 need not be substantially circular as illustrated in FIG. 6 but can take a variety of forms. Each of the plurality of arc chambers (610-A, 610-B, 610-C, and 610-D) is optionally one of the types of arc chambers described above and illustrated in FIG. 1A, 1B, 2A, or 2B.

Plate 620 is rotatably mounted to an ion source via an axle 622. Axle 622 is connected to a rotation assembly 624 that is used to rotate axle 622 and plate 620. A switch 626 is provided which allows an operator to manually control rotation of axle 622 and plate 620. By rotating plate 620 the operator sequentially positions each of the plurality of arc chambers (610-A, 610-B, 610-C, and 610-D) to be operationally connected to said ion source. In the embodiment illustrated in FIG. 6, four arc chambers are mounted to plate 620. If each arc chamber is a directly-heated cathode type arc chamber as illustrated in FIG. 1A and described above, the operator has eight cathodes available for use. As each cathode fails or degrades below an acceptable performance threshold the operator switches to a second cathode in an arc chamber or rotates plate 620 to operationally connect a new arc chamber to the ion source.

The arc chamber embodiments described above include several advantages. First, the useful life of an ion source can be greatly extended by providing a redundant cathode. Since the cathode is prone to malfunction and failure, adding at least a second cathode can double the useful life of the ion source which reduces costs associated with operating an ion implanter. Second, the ion implanter, which operates at vacuum pressures, does not need to be opened and re-secured (i.e., sealed and evacuated) each time a cathode fails. Instead, when a first cathode fails a second cathode can be deployed and energized to continue ion implanter operations, which increases the production or throughput of the ion implanter by reducing shutdown and maintenance time.

In some embodiments an arc chamber comprises an arc chamber housing, at least one repeller element, and a plurality of cathodes. The arc chamber housing defines a reaction cavity and the arc chamber has a plurality of gas injection openings and a recess in at least one wall. Each repeller element comprises a repeller mounted to a clapboard, with the repeller element pivotally mounted to rotate around an axis from a first position extending across the reaction cavity to a second position in the recess of the arc chamber housing. Each cathode is mounted in the reaction cavity such that a first one of the plurality of cathodes is directly exposed to the reaction cavity, and a second one of the plurality of cathodes is covered by the at least one repeller element when the at least one repeller element is in the first position.

In some embodiments an arc chamber comprises an arc chamber housing, a first and second cathode, and a first repeller element. The arc chamber housing defines a reaction cavity including a recess for accepting a the first repeller element. The arc chamber has a plurality of gas injection openings. The first and second cathode are mounted within the arc chamber opposite each other. The first repeller element comprises a repeller mounted to a clapboard, the clapboard having an axial pin, permitting the repeller element to rotate around the axis of the axial pin from a first position in which the clapboard extends across the reaction cavity to a second position in which the clapboard is within the recess of the arc chamber housing, to selectably cover the second cathode when the first cathode is in use and to selectably uncover the second cathode when the second cathode is in use In some embodiments a method for extending the useful life of an ion source comprises providing power to a first cathode of an arc chamber in an ion source, operating the first cathode, detecting a failure or degradation in performance of the first cathode, energizing a second cathode, and continuing operation of the arc chamber with the second cathode.

Although examples are illustrated and described herein, embodiments are nevertheless not limited to the details shown, since various modifications and structural changes can be made therein by those of ordinary skill within the scope and range of equivalents of the claims.

What is claimed is:

1. An apparatus for extending the useful life of an ion source comprising:
    an arc chamber housing defining a reaction cavity, the arc chamber having a plurality of gas injection openings and a recess in at least one wall thereof;
    at least one repeller element, comprising a repeller mounted to a clapboard, said repeller element pivotally mounted to rotate from a first position extending across the reaction cavity to a second position in the recess of the arc chamber housing; and
    a plurality of cathodes, mounted in the reaction cavity such that a first one of the plurality of cathodes is directly exposed to the reaction cavity, and a second one of the plurality of cathodes is covered by the at least one repeller element when the at least one repeller element is in the first position.

2. The apparatus of claim 1, further comprising a power supply for providing electrical power to a selectable one of the plurality of cathodes.

3. The apparatus of claim 1, further comprising a plurality of power supplies, wherein each of the plurality of cathodes is electrically powered independently by a respective one of the plurality of power supplies.

4. The apparatus of claim 1, further comprising:
    at least one rotation assembly connected to the at least one repeller element; and
    at least one manual switch connected to the at least one rotation assembly.

5. The apparatus of claim 4, further comprising:
    at least one detector to monitor cathode performance;
    at least one alarm to notify the operator of cathode failure or degradation of performance; and
    at least one power supply controller.

6. The apparatus of claim 1 further comprising:
    a plurality of said arc chambers mounted to a plate, said plate rotatably mounted to an ion source via an axle, such that rotating said plate allows each of the plurality of said arc chambers to be sequentially operably connected to said ion source.

7. The apparatus of claim 6 further comprising:
    a rotation assembly for rotating said plate connected to said axle; and
    a switch connected to said rotation assembly.

8. An apparatus for extending the useful life of an ion source comprising:
    an arc chamber housing defining a reaction cavity including a recess for accepting a repeller mounted to a clapboard, the arc chamber having a plurality of gas injection openings;
    a first cathode within the arc chamber;
    a second cathode, mounted within the arc chamber opposite the first cathode; and
    a first repeller element, comprising a repeller mounted to a clapboard, the clapboard having an axial pin, permitting said repeller element to rotate from a first position in which the clapboard extends across the reaction cavity to a second position in which the clapboard is within the recess of the arc chamber housing, to selectably cover said second cathode when said first cathode is in use and to selectably uncover said second cathode when said second cathode is in use.

9. The apparatus of claim 8, further comprising a third cathode and a second repeller element, comprising a second repeller mounted to a second clapboard, the second clapboard having a second axial pin, permitting said second repeller element to rotate from a first position, in which the second repeller element covers said third cathode, to a second position in which the second repeller element is disposed within a second recess of the arc chamber housing, the second repeller element being selectably positionable to cover said third cathode when either of said first or second cathodes is in use and to uncover said third cathode when said third cathode is in use.

10. The apparatus of claim 9, further comprising a fourth cathode and a third repeller element, comprising a third repeller mounted to a third clapboard, the third clapboard having a third axial pin, permitting said third repeller element to rotate from a first position, in which the third repeller element covers said fourth cathode, to a second position in which the third repeller element is disposed within a third recess of the arc chamber housing, the third repeller element being selectably positionable to cover said fourth cathode when either of said first, second, or third cathodes is in use and to uncover said fourth cathode when said fourth cathode is in use.

11. The apparatus of claim 8, further comprising a power supply for providing electrical power to a selectable one of the plurality of cathodes.

12. The apparatus of claim 8, further comprising a plurality of power supplies, wherein each of the plurality of cathodes is electrically powered independently by a respective one of the plurality of power supplies.

13. The apparatus of claim 8, further comprising:
at least one rotation assembly connected to the at least one repeller element; and
at least one manual switch connected to the at least one rotation assembly.

14. The apparatus of claim 13, further comprising:
at least one detector to monitor cathode performance;
at least one alarm to notify the operator of cathode failure or degradation of performance; and
at least one power supply controller.

15. The apparatus of claim 8 further comprising:
a plurality of said arc chambers mounted to a plate, said plate rotatably mounted to an ion source via an axle, such that rotating said plate allows each of the plurality of said arc chambers to be sequentially operably connected to said ion source.

16. The apparatus of claim 15 further comprising:
a rotation assembly for rotating said plate connected to said axle; and
a switch connected to said rotation assembly.

17. A method for extending the useful life of an ion source, comprising the steps of:
providing power to a first cathode of an arc chamber in an ion source;
operating said first cathode;
detecting a failure or degradation in performance of said first cathode;
energizing a second cathode upon detection of the failure or degradation in performance of said first cathode and without breaking vacuum in said arc chamber; and
continuing operation of said arc chamber in said ion source.

18. The method of claim 17, further comprising the steps of:
upon detection of the failure or degradation in performance of said first cathode, discontinuing power to said first cathode;
after the power is discontinued, rotating a repeller element within the arc chamber, the repeller element comprising a repeller mounted to a clapboard, to expose said second cathode;
wherein the energizing of said second cathode occurs after said cathode is exposed by the rotation of the repeller element.

19. The method of claim 17, further comprising:
operating said second cathode;
detecting a failure or degradation in performance of said second cathode;
discontinuing power to said second cathode;
rotating a repeller element within the arc chamber, the repeller element comprising a repeller mounted to a clapboard, to expose a third cathode;
energizing said third cathode; and
continuing operation of said arc chamber in said ion source.

20. The method of claim 19, further comprising:
operating said third cathode;
detecting a failure or degradation in performance of said third cathode;
discontinuing power to said third cathode;
rotating a repeller element within the arc chamber, the repeller element comprising a repeller mounted to a clapboard, to expose a fourth cathode;
energizing said fourth cathode; and
continuing operation of said arc chamber in said ion source.

* * * * *